(12) United States Patent
Noguchi

(10) Patent No.: US 11,447,890 B2
(45) Date of Patent: Sep. 20, 2022

(54) CRYSTAL GROWTH APPARATUS

(71) Applicant: SHOWA DENKO K.K., Tokyo (JP)

(72) Inventor: Shunsuke Noguchi, Hikone (JP)

(73) Assignee: SHOWA DENKO K.K., Tokyo (JP)

( * ) Notice: Subject to any disclaimer, the term of this patent is extended or adjusted under 35 U.S.C. 154(b) by 186 days.

(21) Appl. No.: 16/547,709

(22) Filed: Aug. 22, 2019

(65) Prior Publication Data

US 2020/0080232 A1 Mar. 12, 2020

(30) Foreign Application Priority Data

Sep. 6, 2018 (JP) .............................. JP2018-167067

(51) Int. Cl.
| | |
|---|---|
| *C30B 35/00* | (2006.01) |
| *C30B 25/08* | (2006.01) |
| *C30B 25/16* | (2006.01) |
| *C30B 25/12* | (2006.01) |
| *C30B 25/10* | (2006.01) |

(52) U.S. Cl.
CPC ............ *C30B 35/002* (2013.01); *C30B 25/08* (2013.01); *C30B 25/10* (2013.01); *C30B 25/12* (2013.01); *C30B 25/16* (2013.01); *Y10T 117/1068* (2015.01)

(58) Field of Classification Search
CPC ..... C30B 29/36; C30B 23/063; C30B 23/002; C30B 25/10; C30B 25/16; C30B 35/00; C30B 35/002; C30B 23/06; C30B 25/08; C30B 25/12; C30B 29/403; Y10T 117/1068
See application file for complete search history.

(56) References Cited

U.S. PATENT DOCUMENTS 4,866,005 A * 9/1989 Davis ..................... C30B 23/00
117/98

FOREIGN PATENT DOCUMENTS

| CN | 102471930 A | 5/2012 |
|---|---|---|
| CN | 104195640 A | 12/2014 |
| CN | 104395248 A | 3/2015 |
| CN | 107541776 A | 1/2018 |
| EP | 2 878 582 A1 | 6/2015 |

(Continued)

OTHER PUBLICATIONS

European Patent Office, English computer translation of JP2011-219295 (Year: 2021).*

(Continued)

*Primary Examiner* — Matthew J Song
(74) *Attorney, Agent, or Firm* — Sughrue Mion, PLLC

(57) ABSTRACT

A crystal growth apparatus including: a heat source, a crucible including a container body in which a raw material can be received and a lid part on which a seed crystal can be mounted; a first heat insulating part which is disposed externally of the crucible and in which a first through-hole penetrating in a thickness direction is provided; a second heat insulating part which is disposed externally of the first heat insulating part and in which a second through-hole penetrating in a thickness direction is provided; a moving mechanism configured to move the first heat insulating part and the second heat insulating part relative to each other; and a radiation type temperature measuring unit configured to measure a temperature of the crucible via the first through-hole and the second through-hole.

14 Claims, 8 Drawing Sheets

(56) References Cited

FOREIGN PATENT DOCUMENTS

| | | | | |
|---|---|---|---|---|
| JP | 06298594 A | * | 10/1994 | ............ C30B 23/00 |
| JP | 2008-290885 A | | 12/2008 | |
| JP | 2008290885 A | * | 12/2008 | ............ C30B 29/36 |
| JP | 2011-026161 A | | 2/2011 | |
| JP | 2011219287 A | * | 11/2011 | ............ C30B 29/36 |
| JP | 2011219295 A | * | 11/2011 | ............ C30B 29/36 |
| JP | 2012-131679 A | | 7/2012 | |
| JP | 2013-216515 A | | 10/2013 | |
| JP | 2014234331 A | * | 12/2014 | ............ C30B 29/36 |
| JP | 2017-078008 A | | 4/2017 | |
| WO | 2014/003129 A1 | | 1/2014 | |

OTHER PUBLICATIONS

European Patent Office, English computer translation of JP 2008-290885 (Year: 2021).*
European Patent Office, English computer translation of JP 06-298594 (Year: 2021).*
European Patent Office, English computer translation of JP 2014-234331 (Year: 2021).*
Communication dated Feb. 22, 2021 from The State Intellectual Property Office of the P.R. of China in Application No. 201910833016.3.
Notice of Reasons for Rejection dated May 10, 2022 from the Japanese Patent Office in Japanese Application No. 2018-167067.

* cited by examiner

CRYSTAL GROWTH APPARATUS

CROSS-REFERENCE TO RELATED APPLICATION

Priority is claimed on Japanese Patent Application No. 2018-167067, filed Sep. 6, 2018, the content of which is incorporated herein by reference.

BACKGROUND

Field of the Invention

The present disclosure relates to a crystal growth apparatus, and particularly, to a crystal growth apparatus for growing a single crystal of a material such as silicon carbide (SiC).

Description of Related Art

Crystalline materials including a single crystal are widely used in high-tech devices of various industrial fields. For example, compared to silicon (Si), silicon carbide (SiC) has an additional digit in its breakdown field, has about 3 times the bandgap energy, and has about 3 times the thermal conductivity. For this reason, silicon carbide is useful for power devices, high-frequency devices, high-temperature operation devices, etc., and further improvement in quality is required in the future. Further, aluminum nitride (AlN) has about twice the bandgap energy of silicon carbide, and is being researched in view of power devices and so on.

A sublimation method is well known as one method of producing a single crystal of a material as described above. The sublimation method is a method of disposing a seed crystal composed of a single crystal on a mount disposed in a graphite crucible, heating the crucible to supply the seed crystal with a sublimation gas that is sublimated from a raw material powder in the crucible, and growing the seed crystal into a larger seed crystal. Since a temperature condition during the crystal growth in the sublimation method has a great influence on quality of the obtained single crystal, there is a need to accurately measure a temperature of the crucible when the single crystal undergoes crystal growth.

For example, as technology for obtaining a silicon carbide single crystal, an apparatus for producing a silicon carbide single crystal in which a through-hole is provided in an insulator disposed externally of a crucible and a temperature of an outer wall of the crucible is measured from the outside using a radiation thermometer is disclosed in Patent Document 1.

An apparatus for producing a silicon carbide single crystal that includes a holder that holds a material, a mount (a lid) that is installed to block an opening of the holder, an insulator that is disposed externally of the holder, and a temperature measuring hole that is provided at a position of the insulator which faces the mount is disclosed in Patent Document 2.

An apparatus for producing a silicon carbide single crystal that includes a first hole that is provided in a sidewall of a heating container, a second hole that is disposed externally of the heating container and is provided at a position corresponding to the first hole, and a pyrometer that measures a surface temperature of the SiC single crystal inside the heating container via the first hole and the second hole is disclosed in Patent Document 3.

Further, as technology for obtaining a nitride single crystal, an apparatus for producing a nitride single crystal that includes a growth container that has an opening in an upper portion thereof, a susceptor that blocks the opening, a chamber that holds the growth container and the susceptor in an internal space thereof and has a heat shield member on an entire inner wall thereof, and a thermometer that measures a temperature of an outer wall of the growth container via a window provided on the chamber is disclosed in Patent Document 4.

Further, as a constitution that blocks a hole for measuring a temperature, an apparatus for producing $SiO_2$—$TiO_2$-based glass that includes a radiation thermometer that measures a temperature of a growth plane of a glass ingot via observation openings (through-holes) provided in a furnace frame and a furnace wall, and a transparent glass window that is provided on the observation opening of the furnace frame is disclosed in Patent Document 5.

PATENT DOCUMENTS

[Patent Document 1] Japanese Unexamined Patent Application, First Publication No. 2008-290885
[Patent Document 2] Japanese Unexamined Patent Application, First Publication No. 2017-78008
[Patent Document 3] Japanese Unexamined Patent Application, First Publication No. 2013-216515
[Patent Document 4] Japanese Unexamined Patent Application, First Publication No. 2011-26161
[Patent Document 5] PCT International Publication No. WO2014/003129 However, the technologies of Patent Documents 1 to 4 have problems in that, due to a structure in which an internal space in which the crucible is installed always communicates with the outside of the apparatus via a through-hole, heat of the internal space flows out to the outside via the through-hole during heating of a raw material, and the temperature of an outer wall of the crucible is locally lowered around the through-hole, and thus the temperature of the crucible cannot be accurately measured.

Further, there is a risk that, due to a drop in heating efficiency and non-uniformity in temperature of the crucible, a shape of a single crystal ingot impairs symmetry, and a variation in quality occurs.

Further, when the single crystal undergoes crystal growth, a gas in the internal space may flow out to the outside, and a raw material contained in the gas may be recrystallized and precipitated on an inner wall of the through-hole. As a result, due to precipitates attached to the inner wall of the through-hole, the temperature of the crucible cannot be accurately measured in some cases.

In the technology of Patent Document 5, since the transparent glass window is simply disposed in the through-hole of the furnace wall, an outflow of heat occurs at the transparent glass window during heating of a raw material. Accordingly, as in Patent Documents 1 to 4, the temperature of an outer wall of the crucible is locally lowered around the through-hole, and thus it is difficult to accurately measure the temperature of the crucible. Furthermore, a method of curbing the outflow of heat from the through-hole of the furnace wall is not disclosed or suggested in any of Patent Documents 1 to 5.

The present disclosure has been made in view of the above problems, and is directed to providing a crystal growth apparatus capable of realizing an improvement in quality of a crystal by improving heating efficiency and reconciling uniformity of a temperature of a crucible with accurate measurement of the temperature of the crucible.

SUMMARY

The present disclosure provides the following means in order to solve the above problems.

A crystal growth apparatus is comprised of:

a heat source;

a crucible including a container body in which a raw material is to be received and a lid part on which a seed crystal is to be mounted;

a first heat insulating part which is disposed externally of the crucible and in which at least one first through-hole penetrating in a thickness direction is provided;

a second heat insulating part which is disposed externally of the first heat insulating part and in which at least one second through-hole penetrating in a thickness direction is provided;

a moving mechanism configured to move the first heat insulating part and the second heat insulating part relative to each other; and a radiation type temperature measuring unit configured to measure a temperature of the crucible via the first through-hole and the second through-hole.

DETAILED DESCRIPTION

Hereinafter, embodiments of the present disclosure will be described in detail with reference to the drawings.

First Embodiment

Figure 1A:
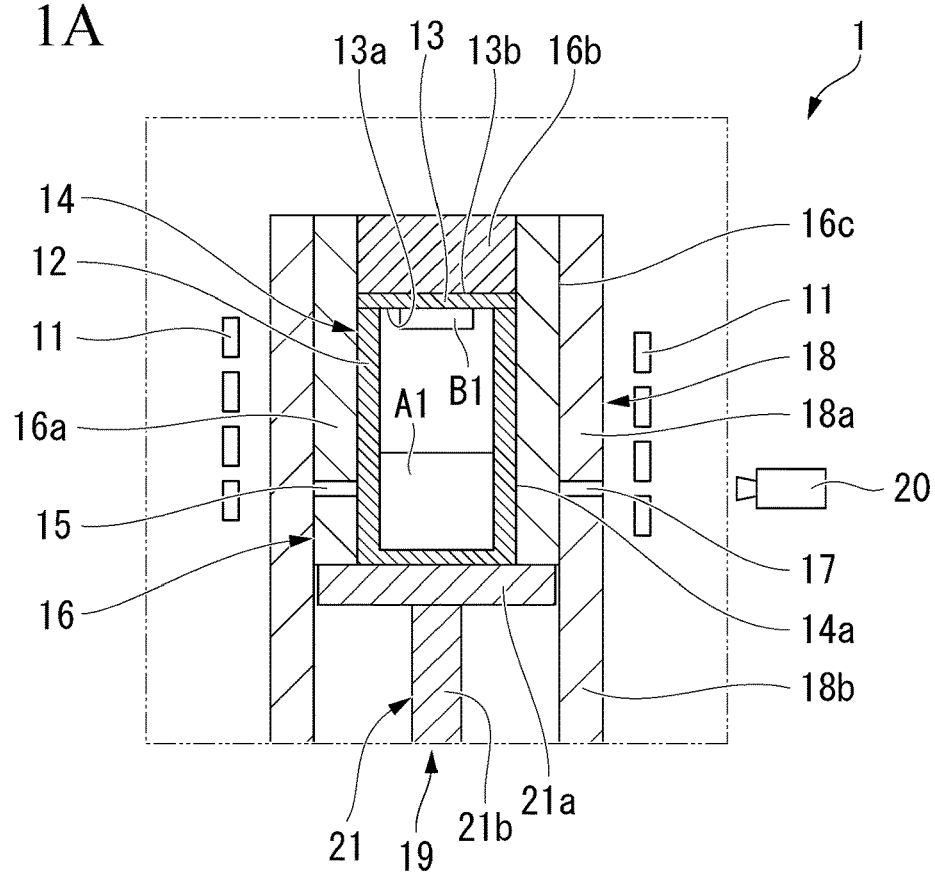
FIG. 1A is a sectional view schematically showing a constitution of a crystal growth apparatus according to a first embodiment of the present disclosure in a state during crystal growth.
Figure 1B:
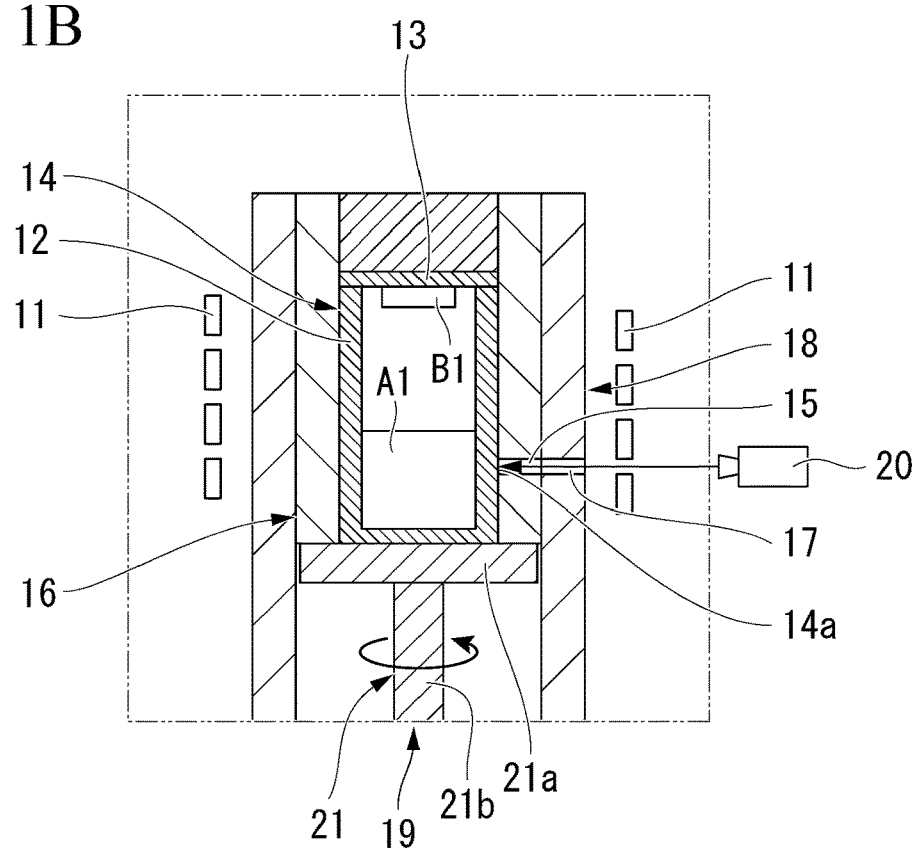
FIG. 1B is a sectional view schematically showing a constitution of the crystal growth apparatus according to the first embodiment in a state when a temperature of a crucible is measured.

FIG. 1A is a sectional view schematically showing a constitution of a crystal growth apparatus according to a first embodiment of the present disclosure in a state during crystal growth. FIG. 1B is a sectional view schematically showing a constitution of the crystal growth apparatus according to the first embodiment in a state when a temperature of a crucible is measured. The drawings used in the following description may show characterized portions in an enlarged scale for convenience in order to facilitate understanding of features, and dimensional ratios or the like of the components are not limited to those shown.

As shown in FIG. 1A, a crystal growth apparatus 1 is comprised of a heat source 11, a crucible 14 that includes a container body 12 in which a raw material A1 can be received and a lid part 13 on which a seed crystal B1 can be mounted, a first heat insulating part 16 which is disposed externally of the crucible 14 and in which a first through-hole 15 (at least one through-hole) penetrating in a thickness direction is provided, a second heat insulating part 18 which is disposed externally of the first heat insulating part 16 and in which a second through-hole 17 (at least one through-hole) penetrating in a thickness direction is provided, a moving mechanism 19 that moves the first heat insulating part 16 and the second heat insulating part 18 relative to each other, and a radiation type temperature measuring unit 20 that measures a temperature of the crucible 14 via the first through-hole 15 and the second through-hole 17.

The heat source 11 is, for example, a high-frequency coil, and heats the raw material A1 using a direct heating method. An induced current is generated near a surface of the crucible 14 by a magnetic field generated when an alternating current flows to the high-frequency coil, Joule heat thereof causes the crucible 14 to generate heat, and the raw material A1 is heated by conduction of the heat. The heat source 11 is not limited to this direct heating method and an indirect heating method may be adopted.

The container body 12 of the crucible 14 is made up of a lower portion and a trunk portion. For example, the lower portion and the trunk portion, which are different members, are formed by junction. However, without being limited thereto, the lower portion and the trunk portion may be integrally formed. The container body 12 is filled with a sufficient amount of the raw material A1 to grow the seed crystal B1.

The lid part 13 is mounted on the container body 12 to block an upper end opening of the container body 12. The seed crystal B1 is fixed to a lower surface 13a of the lid part 13. The seed crystal B1 and the lid part 13 may be fixed using a carbon adhesive, and may be physically brought into close contact with each other by providing a fixing member (not shown).

The crucible 14 preferably has a circular shape in a top view. However, in a case where the moving mechanism 19 is a lifting device (to be described below), the crucible 14 can have a different shape instead of the circular shape.

Materials that are stable at a high temperature and generate less of an impurity gas are preferably used as a material of the crucible 14. To be specific, for example graphite, silicon carbide, and graphite coated with silicon carbide or tantalum carbide (TaC) are preferably used.

The first heat insulating part 16 is movably provided along with the crucible 14, and is loaded, for example, on a loading table (to be described below) of the moving mechanism 19 along with the crucible 14.

The first heat insulating part 16 includes a first sidewall 16a that is disposed to surround an outer surface 14a of the crucible 14, and a first upper wall 16b that is disposed to cover an upper surface of the crucible 14, namely an upper surface 13b of the lid part 13. The first sidewall 16a is separate from the first upper wall 16b, but the first sidewall 16a may be integrated with the first upper wall 16b.

The first heat insulating part 16 preferably has a circular shape, for example, in a top view. However, in the case where the moving mechanism 19 is the lifting device (to be described below), the first heat insulating part 16 can have a different shape instead of the circular shape. The thickness of the first heat insulating part 16 is, for example, 5 mm to 100 mm.

The first heat insulating part 16 is formed of, for example, a material such as carbon fiber, and can stably maintain the temperature of the crucible 14 in a high-temperature area. As long as the first heat insulating part 16 can stably maintain the temperature of the crucible 14 in the high-temperature area, the first heat insulating part 16 can be formed of a different material instead of the carbon fiber after the thickness and thermal conductivity thereof are adjusted.

The first through-hole 15 is, for example, a first transverse hole that is provided to pass through the first sidewall 16a. The first through-hole 15 has a shape and dimensions through which radiant light emitted from the crucible 14 can pass. In a case where the raw material A1 is a powder, the first through-hole 15 is preferably provided at a vertical position corresponding to a region of the crucible 14 in which the raw material A1 is held. Thus, the temperature of the raw material A1 when the seed crystal B1 is grown can be accurately measured.

The second heat insulating part 18 is fixed to a furnace body in the present embodiment. In this case, the first heat insulating part 16 is provided to be movable along with the crucible 14, the moving mechanism 19 moves the crucible 14 and the first heat insulating part 16 relative to the second heat insulating part 18.

In the present embodiment, the second heat insulating part 18 includes a second sidewall 18a that is disposed to surround an outer surface 16c of the first sidewall 16a, and a leg part 18b that supports the second sidewall 18a.

Like the crucible 14 and the first heat insulating part 16, the second heat insulating part 18 preferably has a circular shape in a top view. However, in the case where the moving mechanism 19 is the lifting device (to be described below), the second heat insulating part 18 can have a different shape instead of the circular shape. The thickness of the second heat insulating part 18 is, for example, 5 mm to 100 mm.

The second heat insulating part 18 is formed of, for example, a material such as carbon fiber, and can stably maintain the temperature of the crucible 14 in the high-temperature area. Like the first heat insulating part 16, as long as the second heat insulating part 18 can stably maintain the temperature of the crucible 14 in the high-temperature area, the second heat insulating part 18 can be formed of a different material instead of the carbon fiber.

The second through-hole 17 is, for example, a second transverse hole that is provided to pass through the second sidewall 18a. Like the first through-hole 15, the second through-hole 17 has a shape and dimensions through which radiant light emitted from the crucible 14 can pass. Further, the second through-hole 17 is preferably provided at the same vertical position as the first through-hole 15. Thus, the first through-hole 15 and the second through-hole 17 can reliably cause to communicate with each other by simply turning the crucible 14 and the first heat insulating part 16.

The moving mechanism 19 moves both the crucible 14 and the first heat insulating part 16 relative to the second heat insulating part 18. In the present embodiment, the moving mechanism 19 includes a turning device 21 that is configured to turn the crucible 14 and the first heat insulating part 16 around an axis that extends in a vertical direction. The turning device 21 includes a loading table 21a that loads both the crucible 14 and the first heat insulating part 16, a shaft part 21b that is mounted on a lower portion of the loading table 21a, and a motor (not shown) that rotates the shaft part 21b. All of the crucible 14, the first heat insulating part 16, and the second heat insulating part 18 have circular shapes in a top view, and can be disposed coaxially with one another or equivalent to this.

The radiation type temperature measuring unit 20 is made up of, for example, an optical detection part, a photoelectric conversion part, a temperature output part, and so on, and measures the temperature of the crucible 14, particularly a temperature of the container body 12, on the basis of the radiant light emitted from the crucible 14. The radiation type temperature measuring unit 20 is typically a handheld or mounted radiation thermometer.

The raw material A1 can be composed of, for example, a SiC-containing powder or an AlN-containing powder.

The seed crystal B1 can be composed of any material selected from the group consisting of SiC, AN, GaN, GaAs, and Si. In a case where the raw material A1 is composed of the SiC-containing powder or the AlN-containing powder, the seed crystal B1 is composed of, for example, a SiC single crystal or an AN single crystal. To be specific, the raw material A1 is composed of the SiC-containing powder, and the seed crystal B1 is composed of the SiC single crystal. Alternatively, the raw material A1 is composed of the AlN-containing powder, and the seed crystal B1 is composed of the AN single crystal. However, without being limited thereto, the raw material A1 may be composed of the SiC-containing powder, and the seed crystal B1 may be composed of the AN single crystal. Alternatively, the seed crystal B1 may not be a single crystal, but may be a crystal consisting primarily of a single crystal, or a polycrystal.

In the crystal growth apparatus 1 having the constitution as described above, in the state in which the second heat insulating part 18 is fixed to the furnace body, the turning device 21 turns both the crucible 14 and the first heat insulating part 16, and moves the first through-hole 15 of the first heat insulating part 16 to a position that is shifted from the second through-hole 17 of the second heat insulating part 18. For example, in a top view of the crystal growth apparatus 1, when an axial direction of the second through-hole 17 is 0°, the first through-hole 15 is turned to a position at which an axial direction of the first through-hole 15 becomes 180° (FIG. 1A). Thus, the first through-hole 15 is blocked by the second heat insulating part 18.

Next, the heat source 11 is supplied with power, and heats the raw material A1 in the crucible 14. A heating temperature of the raw material A1 is, for example, 1900 to 2500° C. Due to this heating, the raw material A1 sublimates, and a raw material gas is generated. The raw material gas is supplied onto the seed crystal B1, and the seed crystal B1 undergoes crystal growth.

Further, when the temperature of the crucible 14 is measured, the turning device 21 turns both the crucible 14 and the first heat insulating part 16, and moves the first through-hole 15 of the first heat insulating part 16 to a position that is lined up with the second through-hole 17 of the second heat insulating part 18 in a linear shape. For example, in the top view of the crystal growth apparatus 1, when the axial direction of the second through-hole 17 is 0°, the first through-hole 15 is turned to a position at which the axial direction of the first through-hole 15 becomes 0° (FIG. 1B). Thus, the first through-hole 15 communicates with the second through-hole 17.

The radiant light emitted from the crucible 14 is measured from the radiation type temperature measuring unit 20 via the first through-hole 15 and the second through-hole 17. Since the first through-hole 15 and the second through-hole 17 are lined up with each other in a linear shape, the light emitted from the crucible 14 reaches the radiation type temperature measuring unit 20, and a temperature of the sidewall of the crucible 14 is measured in a short time. When the temperature measurement is completed, the turning device 21 turns both the crucible 14 and the first heat insulating part 16, and moves the first through-hole 15 of the first heat insulating part 16 to the position that is shifted from the second through-hole 17 of the second heat insulating part 18. Thus, the first through-hole 15 is blocked by the second heat insulating part 18, and an outflow of heat and an outflow of the raw material gas from the crucible 14 are curbed. Further, the above operation is repeated as needed, and thereby the temperature of the crucible 14 during crystal growth is measured a plurality of times.

As described above, according to the present embodiment, the first heat insulating part 16 is disposed externally of the crucible 14, and the first through-hole 15 penetrating in a thickness direction is provided in the first heat insulating part 16. Further, the second heat insulating part 18 is disposed externally of the first heat insulating part 16, and the second through-hole 17 penetrating in a thickness direction is provided in the second heat insulating part 18. The moving mechanism 19 moves the first heat insulating part 16 and the second heat insulating part 18 relative to each other, and the radiation type temperature measuring unit 20 measures the temperature of the crucible 14 via the first through-hole 15 and the second through-hole 17. Accordingly, the positions of the first through-hole 15 and the second through-hole 17 are shifted during heating of the crucible 14. Thereby, an outflow of heat from the first through-hole 15 is prevented, and a phenomenon in which the temperature of the outer wall of the crucible 14 around the first through-hole 15 is locally lowered can be prevented. Especially, in a case where the raw material A1 is SiC, SiC needs to be sublimated at a high temperature, and thus the outflow of heat from the first through-hole 15 is prevented. Thereby, a quality of the SiC single crystal can be improved. Further, when the temperature of the crucible 14 is measured, the positions of the first through-hole 15 and the second through-hole 17 are aligned, and thereby the temperature of the crucible 14, particularly the container body 12, can be accurately measured in a short time. In addition, during crystal growth other than in the event of the temperature measurement, the first through-hole 15 is blocked by the second heat insulating part 18.

Thus, the raw material gas hardly reaches the second through-hole 17, and the raw material is hardly precipitated on an inner wall of the second through-hole 17. A failure in the temperature measurement caused by presence of precipitates does not occur. Therefore, an improvement in quality of a crystal can be realized by improving heating efficiency and reconciling uniformity of the temperature of the crucible with accurate measurement of the temperature of the crucible.

Further, since all of the crucible 14, the first heat insulating part 16, and the second heat insulating part 18 have circular shapes in a sectional view in a horizontal direction, and are disposed coaxially with one another or equivalent to this, and since the turning device 21 turns the crucible 14 and the first heat insulating part 16 around the axis extending in the vertical direction, the first heat insulating part 16 and the second heat insulating part 18 can be moved relative to each other with ease.

Furthermore, since the first heat insulating part 16 includes the first sidewall 16a that is disposed to surround the outer surface 14a of the crucible 14, since the first through-hole 15 is the first transverse hole that is provided to pass through the first sidewall 16a, since the second heat insulating part 18 includes the second sidewall 18a that is disposed to surround the outer surface 16c of the first sidewall 16a, and since the second through-hole 17 is the second transverse hole that is provided to pass through the second sidewall 18a, the positions of the first transverse hole and the second transverse hole can be shifted in a transverse direction or be aligned by turning the crucible 14 and the first heat insulating part 16, and the uniformity of the temperature of the crucible can be compatible with the accurate measurement of the temperature of the crucible.

Second Embodiment

Figure 2A:
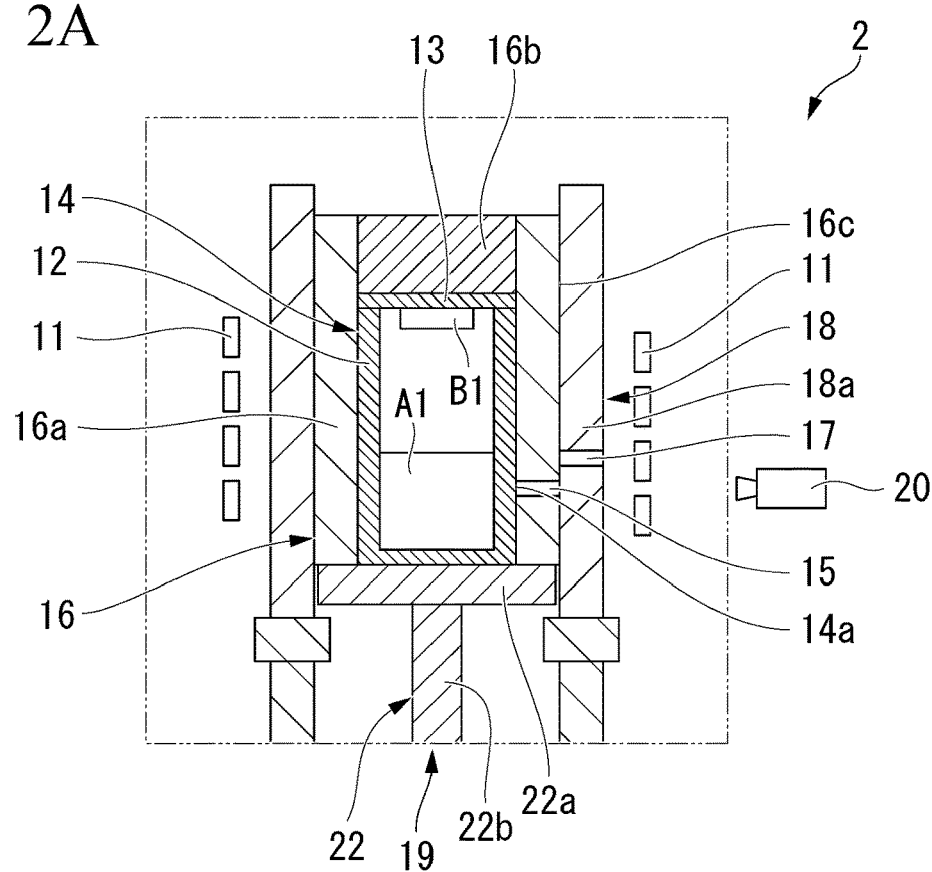
FIG. 2A is a sectional view schematically showing a constitution of a crystal growth apparatus according to a second embodiment of the present disclosure in a state during crystal growth.
Figure 2B:
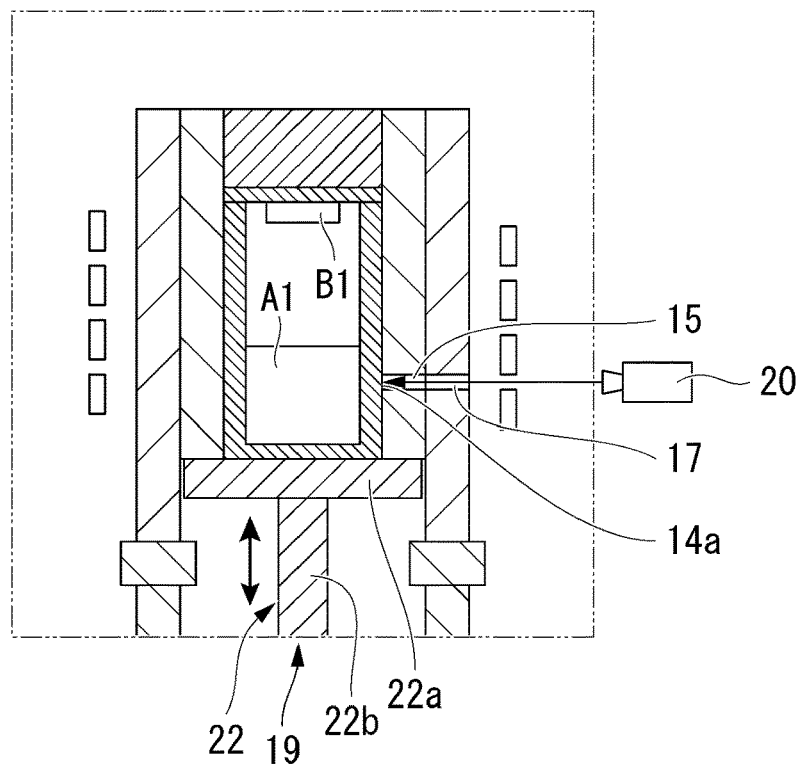
FIG. 2B is a sectional view schematically showing a constitution of the crystal growth apparatus according to the second embodiment in a state when a temperature of a crucible is measured.

FIG. 2A is a sectional view schematically showing a constitution of a crystal growth apparatus 2 according to a second embodiment of the present disclosure in a state during crystal growth. FIG. 2B is a sectional view schematically showing a constitution of the crystal growth apparatus 2 according to the second embodiment in a state when a temperature of a crucible is measured. The crystal growth apparatus 2 of the second embodiment is different from that of the first embodiment in that a moving mechanism 19 includes a lifting device instead of the turning device. The components that are the same as those of the first embodiment will be given the same reference numbers as in the first embodiment, and different portions will be described below.

As shown in FIG. 2A, the moving mechanism 19 includes a lifting device 22 that raises/lowers a crucible 14 and a first heat insulating part 16. The lifting device 22 includes a loading table 22a that loads both the crucible 14 and the first heat insulating part 16, a shaft part 22b that is mounted on a lower portion of the loading table 22a, and a cylinder body (not shown) that is installed to make the shaft part 22b movable in a vertical direction.

A second through-hole 17 is a second transverse hole that is provided to pass through a second sidewall 18a. In the present embodiment, the second through-hole 17 is preferably provided at the same transverse (circumferential) position as a first through-hole 15. Thus, the first through-hole 15 and the second through-hole 17 can reliably communicate with each other by simply raising/lowering the crucible 14 and the first heat insulating part 16.

In the crystal growth apparatus 2, during or before heating of the crucible 14, the lifting device 22 moves both the crucible 14 and the first heat insulating part 16 downward (or upward), and moves the first through-hole 15 of the first heat insulating part 16 to a position shifted from the second through-hole 17 of the second heat insulating part 18. Thus, the first through-hole 15 is blocked by a second heat insulating part 18.

On the other hand, when the temperature of the crucible is measured, the lifting device 22 moves both the crucible 14 and the first heat insulating part 16 upward (or downward), and moves the first through-hole 15 of the first heat insulating part 16 to a position lined up with the second through-hole 17 of the second heat insulating part 18 (FIG. 2B). Thus, the first through-hole 15 communicates with the second through-hole 17, and the temperature of the crucible 14 is measured in this state.

In this way, in the present embodiment, when the crucible 14 is heated, the first through-hole 15 is blocked by the second heat insulating part 18, and an outflow of heat and an outflow of a raw material gas from the crucible 14 are curbed. Further, when the temperature of the crucible 14 is measured, the first through-hole 15 communicates with the second through-hole 17, and the temperature of the crucible 14, particularly the container body 12, can be measured by a radiation type temperature measuring unit 20.

Therefore, the same effects as in the first embodiment can be exhibited.

Third Embodiment

Figure 3:
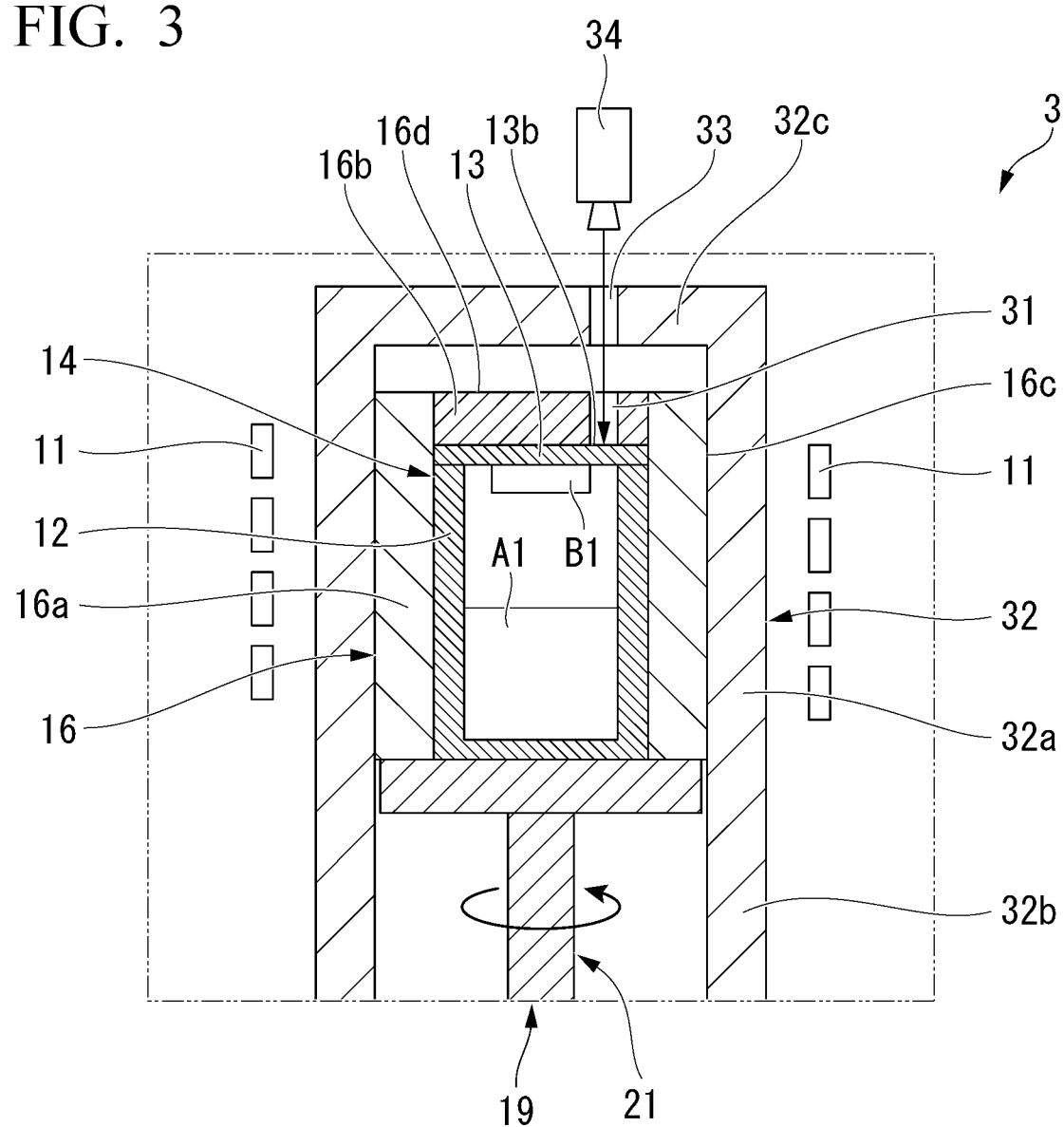
FIG. 3 is a sectional view schematically showing a constitution of a crystal growth apparatus according to a third embodiment of the present disclosure.

FIG. 3 is a sectional view schematically showing a constitution of a crystal growth apparatus 3 according to a third embodiment of the present disclosure. The crystal growth apparatus 3 of the third embodiment is different from that of the first embodiment in that a first through-hole and a second through-hole are provided above a crucible 14. The components that are the same as those of the first embodiment will be given the same reference numbers as in the first embodiment, and different portions will be described below.

As shown in FIG. 3, a first heat insulating part 16 includes a first upper wall 16b that is disposed to cover an upper surface 13b of a lid part 13, and a first through-hole 31 penetrating in a thickness direction is provided in the first upper wall 16b. The first through-hole 31 is, for example, a first longitudinal hole that is provided to pass through the first upper wall 16b. The first through-hole 31 is preferably provided at a position corresponding to a position at which a seed crystal B1 is mounted, namely in the vicinity of the seed crystal B1. Thus, the temperature of the seed crystal B1 when the seed crystal B1 is grown can be accurately measured.

A second heat insulating part 32 includes a second sidewall 32a that is disposed to surround the outer surface 16c of the first sidewall 16a, a leg part 32b that supports the second sidewall 32a, and a second upper wall 32c that is disposed to cover an upper surface 16d of the first upper wall 16b. A second through-hole 33 penetrating in a thickness direction is provided in the second upper wall 32c.

The second through-hole 33 is, for example, a second longitudinal hole that is provided to pass through the second upper wall 32c in a vertical direction. The second through-hole 33 is preferably provided at the same position as the first through-hole 31 in a radial direction centered on a turning axis in a top view of the crystal growth apparatus 3. Thus, the first through-hole 31 and the second through-hole 33 are caused to communicate with each other by simply turning the crucible 14 and the first heat insulating part 16.

A radiation type temperature measuring unit 34 measures the temperature of the crucible 14, particularly a temperature of the lid part 13, on the basis of radiant light emitted from above the crucible 14.

In the crystal growth apparatus 3, during or before heating of the crucible 14, both the crucible 14 and the first heat insulating part 16 are turned, and the first through-hole 31 of the first heat insulating part 16 is moved to a position shifted from the second through-hole 33 of the second heat insulating part 32. In the crystal growth apparatus 3 of FIG. 3, a gap between the first upper wall 16b and the second upper wall 32c is provided. However, as long as the first through-hole 31 and the second through-hole 33 have a shifted position relationship, a distance of a transfer route of heat that is directed from the crucible 14 to the outside of the apparatus is increased, and an outflow of heat can be curbed. Further, the second upper wall 32c may be disposed such that there is no gap between the first upper wall 16b and the second upper wall 32c.

When the temperature of the crucible is measured, both the crucible 14 and the first heat insulating part 16 are turned, and the first through-hole 31 of the first heat insulating part 16 is moved to a position that is lined up with the second through-hole 33 of the second heat insulating part 32 in a linear shape. Thus, the first through-hole 31 communicates with the second through-hole 33, and the temperature of the crucible 14 is measured in this state.

According to the present embodiment, when the crucible 14 is heated, an outflow of heat and an outflow of a raw material gas from the crucible 14 are curbed by shifting positions of the first through-hole 31 and the second through-hole 33. Further, when the temperature of the crucible 14 is measured, the positions of the first through-hole 31 and the second through-hole 33 are aligned, and thereby the temperature of the crucible 14, particularly the lid part 13, can be measured by the radiation type temperature measuring unit 34. Therefore, a temperature of a seed crystal B1 during crystal growth can be accurately measured, and the same effects as in the first embodiment can be exhibited.

Fourth Embodiment

Figure 4:
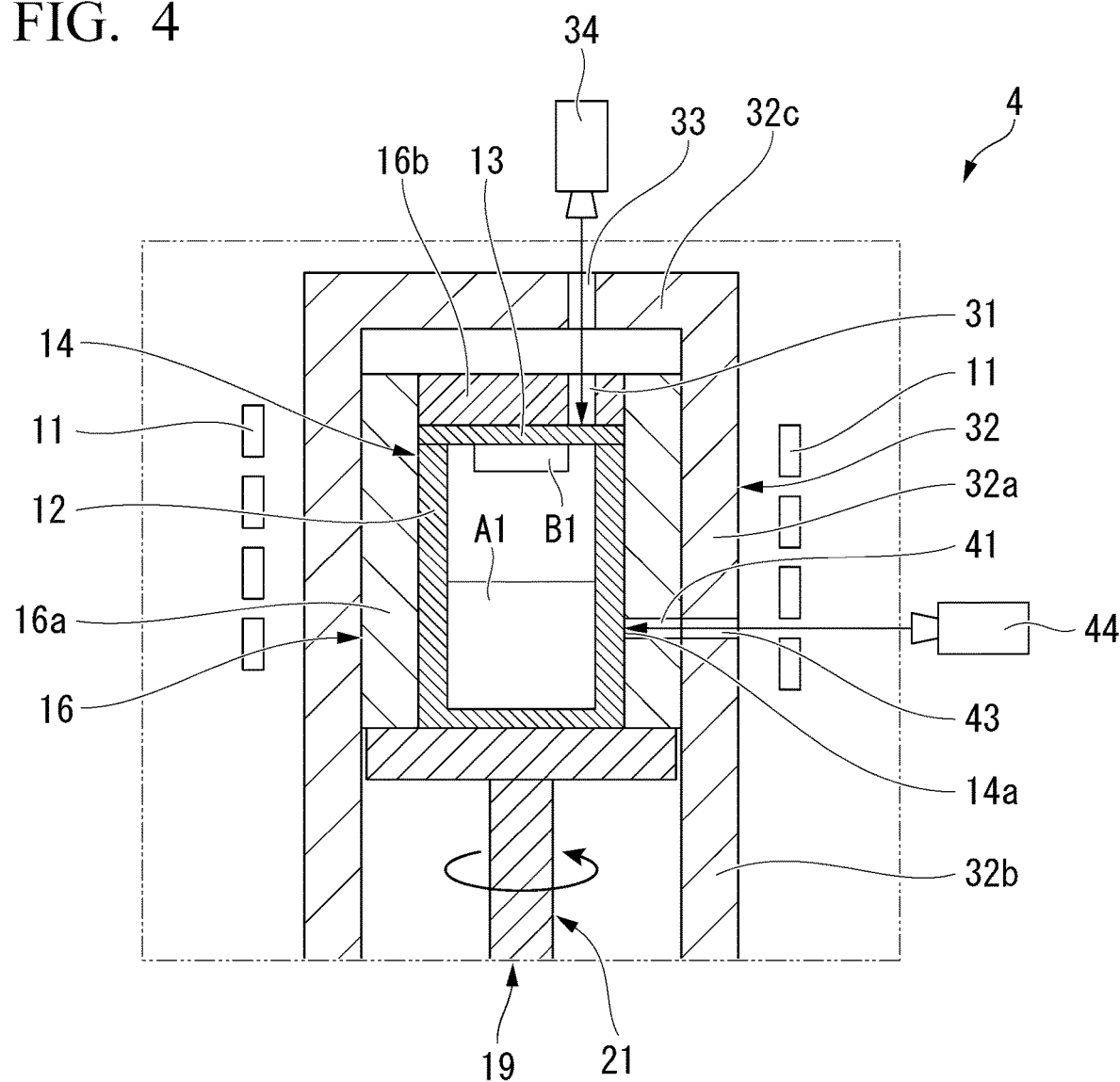
FIG. 4 is a sectional view schematically showing a constitution of a crystal growth apparatus according to a fourth embodiment of the present disclosure.

FIG. 4 is a sectional view schematically showing a constitution of a crystal growth apparatus 4 according to a fourth embodiment of the present disclosure. The crystal growth apparatus 4 of the fourth embodiment is different from that of the third embodiment in that two first through-holes are provided in a first heat insulating part and two second through-holes are provided in a second heat insulating part. The components that are the same as those of the third embodiment will be given the same reference numbers as in the third embodiment, and different portions will be described below.

As shown in FIG. 4, the two first through-holes 31 and 41 provided in the first heat insulating part 16 are, for example, a first longitudinal hole that is provided to pass through a first upper wall 16b, and a first transverse hole that is provided to pass through a first sidewall 16a. Further, the two second through-holes 33 and 43 provided in the second heat insulating part 32 are, for example, a second longitudinal hole that is provided to pass through a second upper wall 32c, and a second transverse hole that is provided to pass through a second sidewall 32a.

As described above, a radiation type temperature measuring unit 34 measures a temperature of a lid part 13 on the basis of radiant light emitted from above a crucible 14. Further, a radiation type temperature measuring unit 44 measures a temperature of the container body 12 on the basis of radiant light emitted from a lateral surface of the crucible 14. In the crystal growth apparatus 4, when or before the crucible 14 is heated, a turning device 21 turns both the crucible 14 and the first heat insulating part 16, and moves the first through-hole 31 of the first heat insulating part 16 to a position shifted from the second through-hole 33 of the second heat insulating part 32. Further, the turning device 21 moves the first through-hole 41 of the first heat insulating part 16 to a position shifted from the second through-hole 43 of the second heat insulating part 32.

Further, when a temperature of the crucible is measured, the turning device 21 turns both the crucible 14 and the first heat insulating part 16, and moves the first through-hole 31 of the first heat insulating part 16 to a position that is lined up with the second through-hole 33 of the second heat insulating part 32 in a linear shape. Further, the turning device 21 moves the first through-hole 41 of the first heat insulating part 16 to a position that is lined up with the second through-hole 43 of the second heat insulating part 32 in a linear shape. Thus, the first through-hole 31 communicates with the second through-hole 33, and the first through-hole 41 communicates with the second through-hole 43. In this state, both the temperature of the lid part 13 and the temperature of the container body 12 are measured.

According to the present embodiment, the temperature of the crucible 14, particularly the temperature of the lid part 13 and the temperature of the container body 12, can be measured by the radiation type temperature measuring units 34 and 44. Therefore, both a temperature of a seed crystal B1 and a temperature of a raw material A1 during crystal growth can be measured. Particularly, in a case where all of the crucible 14, the first heat insulating part 16, and the second heat insulating part 32 have circular shapes in a sectional view in a horizontal direction and are disposed coaxially with one another or equivalent to this, both the temperature of the seed crystal B1 and the temperature of the raw material A1 during crystal growth can be simultaneously measured by simply turning the crucible 14 and the first heat insulating part 16 around an axis extending in a vertical direction.

Fifth Embodiment

Figure 5:
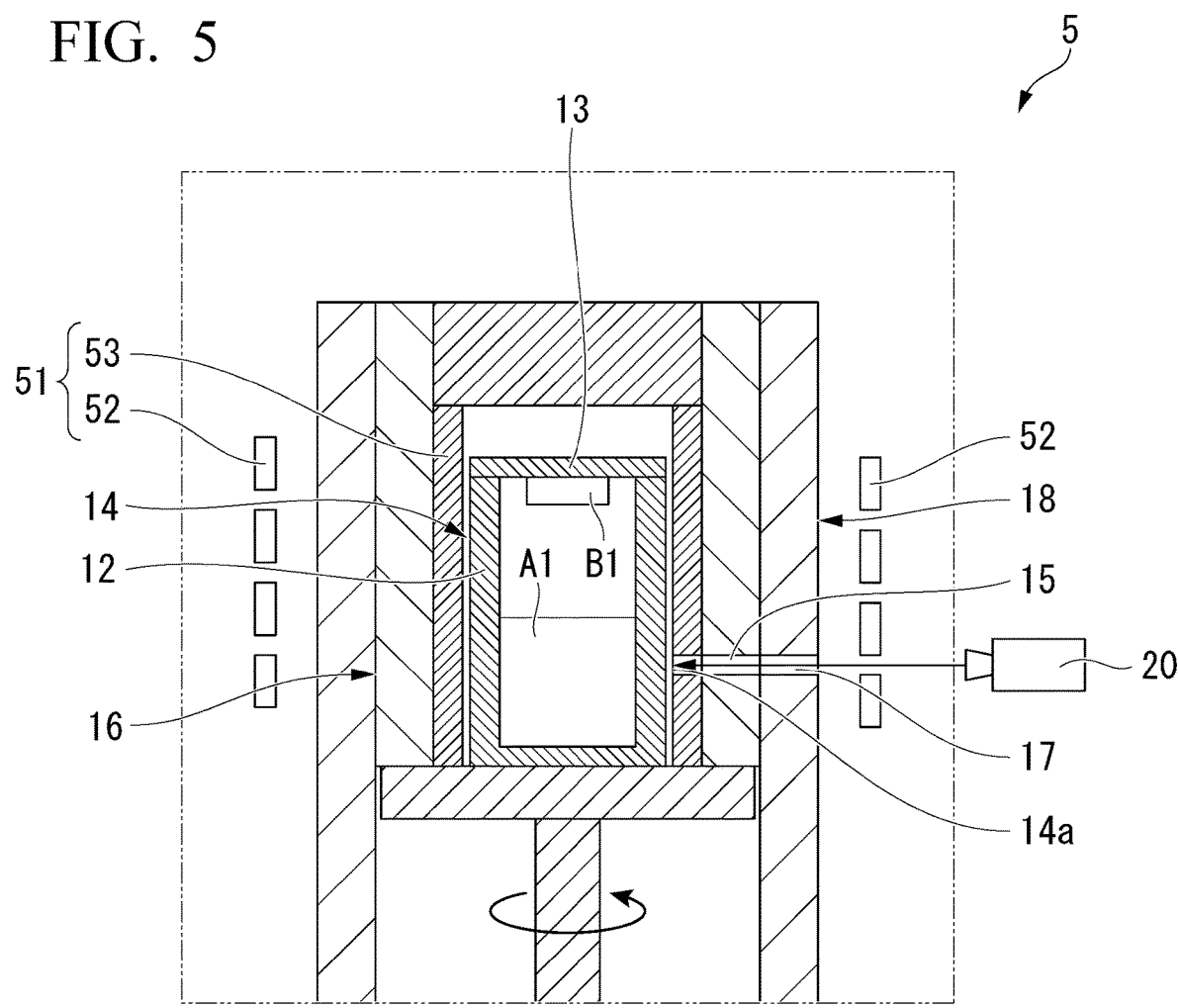
FIG. 5 is a sectional view schematically showing a constitution of a crystal growth apparatus according to a fifth embodiment of the present disclosure.
Figure 6:
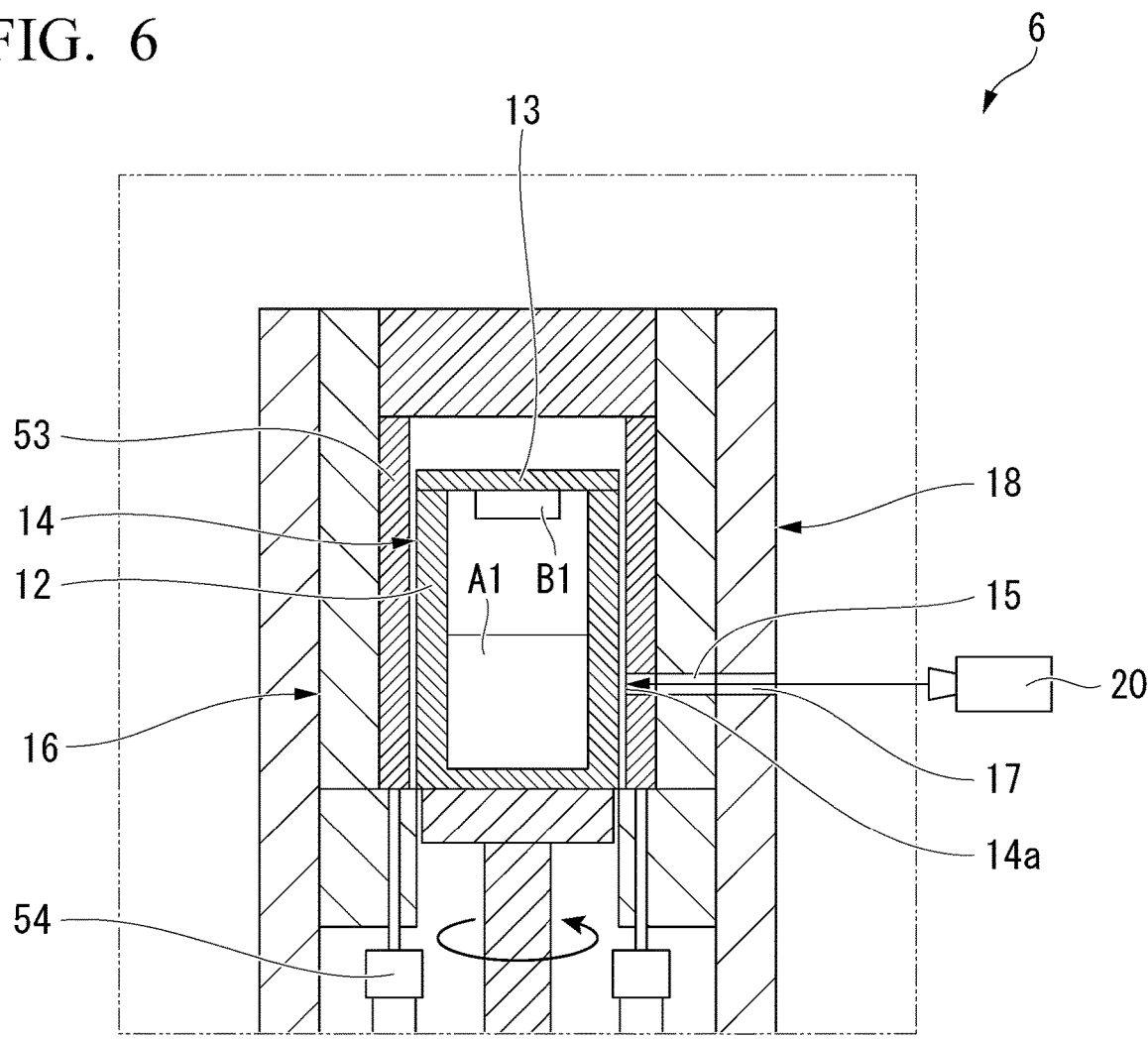
FIG. 6 is a sectional view showing a modification of the crystal growth apparatus of FIG. 5.

FIG. 5 is a sectional view schematically showing a constitution of a crystal growth apparatus 5 according to a fifth embodiment of the present disclosure, and FIG. 6 is a view showing a modification of the crystal growth apparatus 5 of FIG. 5. In the crystal growth apparatus 5 of FIG. 5 and a crystal growth apparatus 6 of FIG. 6, a constitution of a heat source is different from that of the first embodiment. The components that are the same as those of the first embodiment will be given the same reference numbers as in the first embodiment, and different portions will be described below.

As shown in FIG. 5, the heat source 51 of the crystal growth apparatus 5 includes a high-frequency coil 52 and a heater 53. For example, a graphite heater can be used as the heater 53. The heater 53 is provided between the crucible 14 and the first heat insulating part 16, and is preferably disposed to surround an outer surface 14a of a crucible 14. The constitution of the heat source 51 is not limited to this, and may be another constitution in which a raw material A1 can be heated by an indirect heating method.

Further, as shown in FIG. 6, only a heater 53 is provided on the crystal growth apparatus 6 as the heat source, and electrodes 54 capable of supplying power from the outside may be connected to the heater 53. In this case, the heat source is not limited to the heater, and may have another constitution in which the raw material A1 can be heated by a resistance heating method.

The same effects as in the first embodiment can also be exhibited by the present embodiment.

Sixth Embodiment

Figure 7:
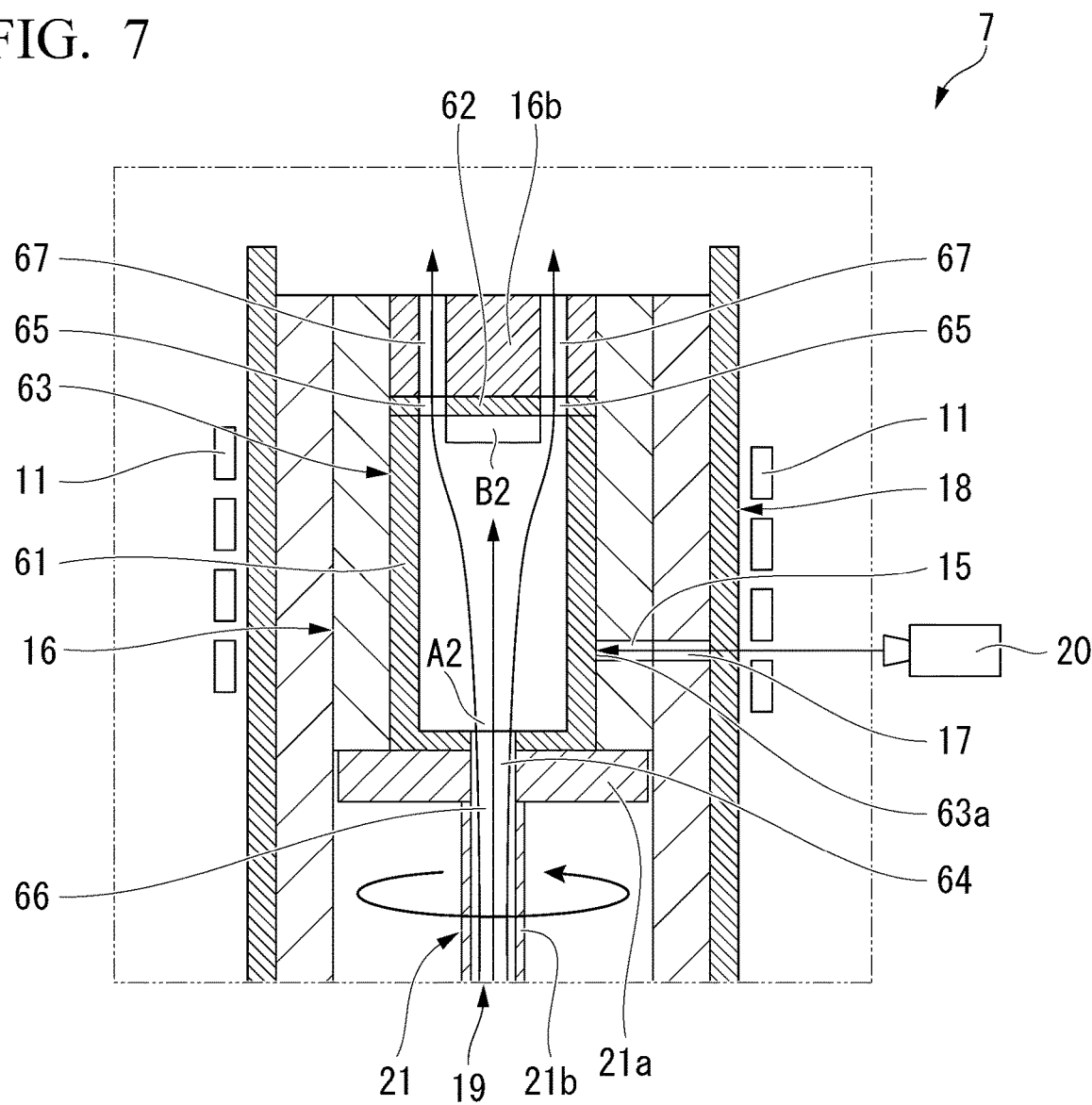
FIG. 7 is a sectional view schematically showing a constitution of a crystal growth apparatus according to a sixth embodiment of the present disclosure.

FIG. 7 is a sectional view schematically showing a constitution of a crystal growth apparatus 7 according to a sixth embodiment of the present disclosure. The crystal growth apparatus 7 of the sixth embodiment is different from that of the first embodiment in that a raw material is a gas, and is subjected to crystal growth by a gas method. The components that are the same as those of the first embodiment will be given the same reference numbers as in the first embodiment, and different portions will be described below.

The crystal growth apparatus 7 includes a first gas introduction part 64 that is provided on a container body 61 of a crucible 63, a first gas discharge part 65 that is provided on a lid part 62 of the crucible 63, a second gas introduction part 66 that is provided to pass through the centers of a loading table 21a and a shaft part 21b of a turning device 21 and communicates with the first gas introduction part 64, and a second gas discharge part 67 that is provided on a first upper wall 16b of a first heat insulating part 16 and communicates with the first gas discharge part 65. A moving mechanism 19 includes the turning device 21 in the present embodiment, but it may include a lifting device instead of the turning device.

The shape of the first gas introduction part 64 has no limitation, but may be, for example, a round hole. The second gas introduction part 66 has a shape corresponding to the shape of the first gas introduction part 64, and preferably has the shape of a round hole provided at the same position as the first gas introduction part 64 in a top view of the crystal growth apparatus 7.

The shape of the first gas discharge part 65 is, for example, an annular hole. The second gas discharge part 67 has a shape corresponding to the shape of the first gas discharge part 65, and preferably has the shape of an annular hole provided at the same position as the first gas discharge part 65 in the top view of the crystal growth apparatus 7.

A raw material A2 is composed of, for example, a gas containing Si and C, or a gas containing Ga and As. In this case, a seed crystal B2 is composed of, for example, a SiC single crystal or a GaN single crystal.

In the crystal growth apparatus 7, the gas-based raw material A2 is supplied from below the crystal growth apparatus 7 into the crucible 63 via the second gas introduction part 66 and the first gas introduction part 64, and is discharged to the outside of the crucible 63 via the first gas discharge part 65 and the second gas discharge part 67. A gas flow (arrows inside the furnace in FIG. 7) of the raw material A2 directed from the first gas introduction part 64 to the first gas discharge part 65 occurs in the crucible 63, and the raw material A2 flows near a lower surface and an outer circumferential surface of the seed crystal B2. Thus, the seed crystal B2 is grown.

In a case where the seed crystal B2 is grown by a gas method, measuring a temperature of a sidewall of the crucible 63 is important for controlling decomposition of the raw material A2. According to the present embodiment, a temperature of an outer surface 63a of the crucible 63 can be accurately measured, and an improvement in quality of a crystal can be realized.

Seventh Embodiment

Figure 8:
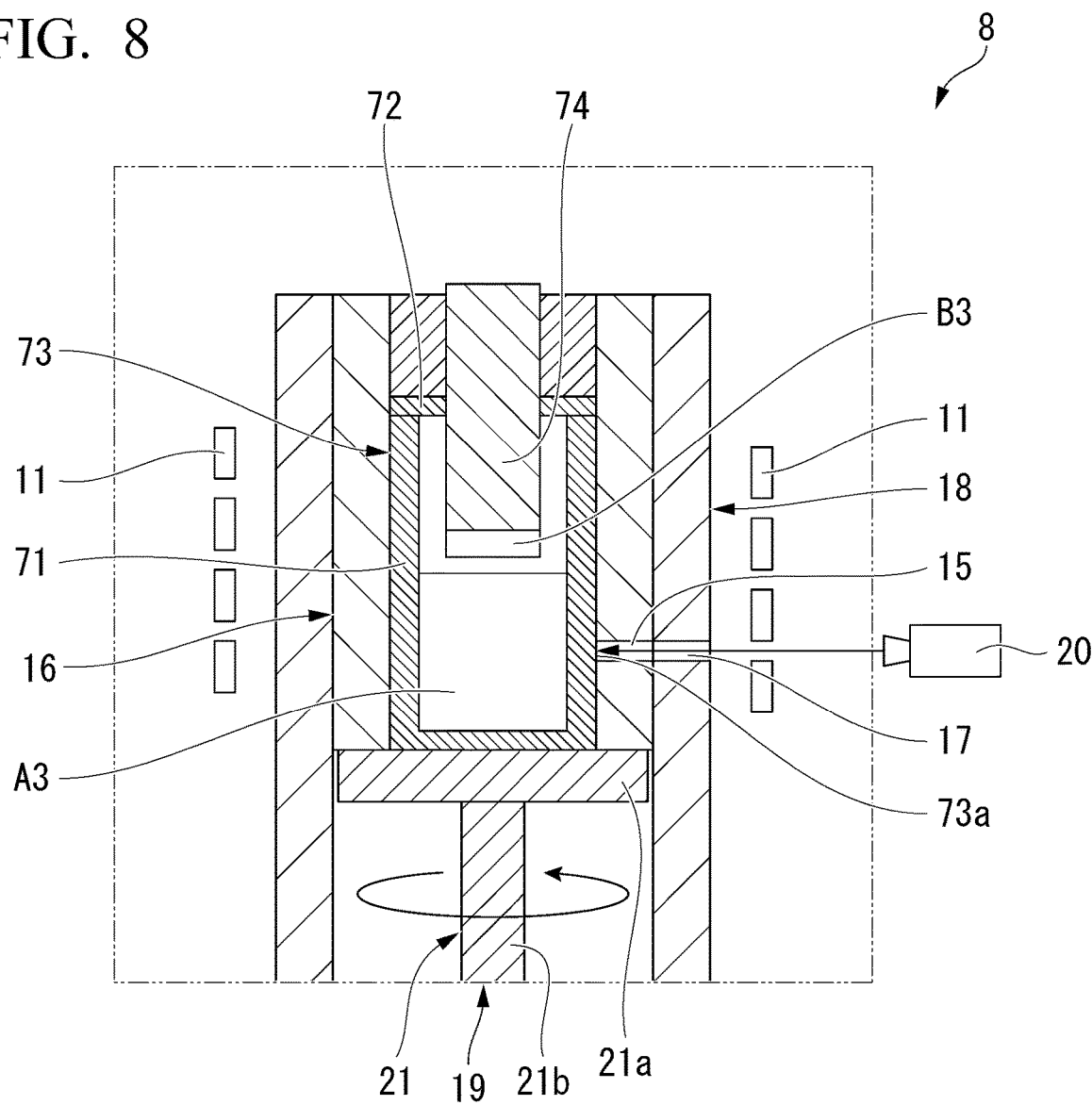
FIG. 8 is a sectional view schematically showing a constitution of a crystal growth apparatus according to a seventh embodiment of the present disclosure.

FIG. 8 is a sectional view schematically showing a constitution of a crystal growth apparatus 8 according to a seventh embodiment of the present disclosure. The crystal growth apparatus 8 of the seventh embodiment is different from that of the first embodiment in that a raw material is a liquid, and is subjected to crystal growth by a solution method. The components that are the same as those of the first embodiment will be given the same reference numbers as in the first embodiment, and different portions will be described below.

The crystal growth apparatus 8 is comprised of a crucible 73 that includes a container body 71 in which a raw material A3 can be received and a lid part 72 on which a seed crystal B3 can be mounted, and a support member 74 that is mounted on the lid part 72 and liftably supports a seed crystal B3 in the crucible 73. The support member 74 is, for example, a graphite rod, and the seed crystal B3 is mounted on a lower end thereof. In other words, the seed crystal B3 is mounted on the lid part 72 via the support member 74.

The raw material A3 is composed of, for example, a liquid containing Si and C, or a liquid containing Si. In this case, the seed crystal B3 is composed of, for example, a SiC single crystal or a Si single crystal.

In the crystal growth apparatus 8, the seed crystal B3 mounted on the lower end of the support member 74 is immersed in the raw material A3 of the crucible 73 by lowering the support member 74. In a state in which the seed crystal B3 is immersed in the raw material A3, the raw material A3 is heated, and then the seed crystal B3 is pulled up. Thus, the seed crystal B3 is grown.

Even in a case where the seed crystal B3 is grown by a solution method, measuring a temperature of a sidewall of the crucible 73 is important for controlling crystal growth. According to the present embodiment, a temperature of an outer surface 73a of the crucible 73 can be accurately measured, and an improvement in quality of a crystal can be realized.

While preferred embodiments of the present disclosure have been described in detail, the present disclosure is not limited to the specific embodiments, and can be variously modified and changed without departing from the spirit and scope of the present disclosure which are defined in the claims.

For example, the crystal growth apparatus is comprised of the first heat insulating part and the second heat insulating part in the above embodiments, but it is not limited thereto and may include three or more heat insulating parts. In a case where the crystal growth apparatus includes three or more heat insulating parts, at least one first through-hole penetrating in a thickness direction is provided in each of the three or more heat insulating parts.

Further, in the above embodiments, the first heat insulating part is movably provided, and the second heat insulating part is fixed to the furnace body. However, without being limited thereto, the first heat insulating part may be fixed to the furnace body, and the second heat insulating part may be movably provided. Furthermore, both the first heat insulating part and the second heat insulating part may be movably provided. In this case, the moving mechanism can include the first moving mechanism that moves the first heat insulating part, and the second moving mechanism that moves the second heat insulating part.

Further, in the above embodiments, the first heat insulating part is movably provided along with the crucible. However, without being limited thereto, the first heat insulating part may be provided to be movable relative to the crucible. In this case, the moving mechanism may include the first moving mechanism that moves the crucible, and the second moving mechanism that moves the first heat insulating part.

While preferred embodiments of the invention have been described and shown above, it should be understood that these are exemplary of the invention and are not to be considered as limiting. Additions, omissions, substitutions, and other modifications can be made without departing from the spirit or scope of the present disclosure. Accordingly, the invention is not to be considered as being limited by the foregoing description, and is only limited by the scope of the appended claims.

What is claimed is:

1. A crystal growth apparatus comprising:
    a heat source;
    a crucible including a container body in which a raw material is to be received and a lid part on which a seed crystal is to be mounted;
    a first heat insulating part which is disposed externally of the crucible and in which at least one first through-hole penetrating in a thickness direction is provided;
    a second heat insulating part which is disposed externally of the first heat insulating part and in which at least one second through-hole penetrating in a thickness direction is provided;
    a moving mechanism configured to move the first heat insulating part and the second heat insulating part relative to each other, and to switch between a state in which the first through-hole and the second through-hole communicate with each other and a state in which the first and second through holes do not communicate with each other; and
    a radiation type temperature measuring unit configured to measure a temperature of the crucible via the first through-hole and the second through-hole,
    wherein the first heat insulating part covers an upper surface of the crucible and an outer surface of the crucible from a lower end of the outer surface of the crucible to an upper end of the outer surface of the crucible.

2. The crystal growth apparatus according to claim 1, wherein:
    the first heat insulating part is movably provided along with the crucible;
    the second heat insulating part is fixed to a furnace body; and
    the moving mechanism is configured to move both the crucible and the first heat insulating part relative to the second heat insulating part.

3. The crystal growth apparatus according to claim 2, wherein:
    all of the crucible, the first heat insulating part, and the second heat insulating part have circular shapes in a top view, and are disposed coaxially with one another or equivalent thereto; and
    the moving mechanism includes a turning device that is configured to turn the crucible and the first heat insulating part around an axis extending in a vertical direction.

4. The crystal growth apparatus according to claim 3, wherein:
    the first heat insulating part includes a first sidewall that is disposed to surround the outer surface of the crucible;
    the at least one first through-hole is a first transverse hole that is provided to pass through the first sidewall;
    the second heat insulating part includes a second sidewall that is disposed to surround an outer surface of the first sidewall; and
    the at least one second through-hole is a second transverse hole that is provided to pass through the second sidewall.

5. The crystal growth apparatus according to claim 3, wherein:
    the first heat insulating part includes a first upper wall that is disposed to cover the upper surface of the crucible;
    the first through-hole is a first longitudinal hole that is provided to pass through the first upper wall;
    the second heat insulating part includes a second upper wall that is disposed to cover an upper surface of the first upper wall; and the second through-hole is a second longitudinal hole that is provided to pass through the second upper wall.

6. The crystal growth apparatus according to claim 3, wherein:
the first heat insulating part includes a first sidewall that is disposed to cover the outer surface of the crucible, and a first upper wall that is disposed to cover the upper surface of the crucible;
the at least one first through-hole is a first longitudinal hole that is provided to pass through the first upper wall, and a first transverse hole that is provided to pass through the first sidewall;
the second heat insulating part includes a second sidewall that is disposed to cover the outer surface of the first sidewall, and a second upper wall that is disposed to cover an upper surface of the first upper wall; and
the at least one second through-hole is a second longitudinal hole that is provided to pass through the second upper wall, and a second transverse hole that is provided to pass through the second sidewall.

7. The crystal growth apparatus according to claim 2, wherein the moving mechanism includes a lifting device that raises/lowers the crucible and the first heat insulating part.

8. The crystal growth apparatus according to claim 7, wherein:
the first heat insulating part includes a first sidewall that is disposed to cover a lateral surface of the crucible;
the at least one first through-hole is a first transverse hole that is provided to pass through the first sidewall;
the second heat insulating part includes a second sidewall that is disposed to cover a lateral surface of the first sidewall; and
the at least one second through-hole is a second transverse hole that is provided to pass through the second sidewall.

9. The crystal growth apparatus according to claim 1, wherein the moving mechanism includes a lifting device that raises/lowers the crucible and the first heat insulating part.

10. The crystal growth apparatus according to claim 9, wherein:
the first heat insulating part includes a first sidewall that is disposed to cover a lateral surface of the crucible;
the at least one first through-hole is a first transverse hole that is provided to pass through the first sidewall;
the second heat insulating part includes a second sidewall that is disposed to cover a lateral surface of the first sidewall; and
the at least one second through-hole is a second transverse hole that is provided to pass through the second sidewall.

11. The crystal growth apparatus according to claim 1, wherein the seed crystal is composed of any material selected from the group consisting of SiC, AlN, GaN, GaAs, and Si.

12. The crystal growth apparatus according to claim 11, wherein:
the raw material is formed of a SiC-containing powder or an AlN-containing powder; and
the seed crystal is composed of a SiC single crystal or an AlN single crystal.

13. The crystal growth apparatus according to claim 11, wherein:
the raw material is formed of a gas containing Si and C or a gas containing Ga and As; and
the seed crystal is composed of a SiC single crystal or a GaN single crystal.

14. The crystal growth apparatus according to claim 11, wherein:
the raw material is formed of a liquid containing Si and C or a liquid containing Si; and
the seed crystal is composed of a SiC single crystal or a Si single crystal.

* * * * *